United States Patent
Palm et al.

(10) Patent No.: US 12,490,543 B2
(45) Date of Patent: Dec. 2, 2025

(54) ARRANGEMENT, DEVICE, AND METHOD FOR HEAT TREATING A MULTILAYER BODY

(71) Applicant: (CNBM) BENGBU DESIGN & RESEARCH INSTITUTE FOR GLASS INDUSTRY CO., LTD, Bengbu (CN)

(72) Inventors: Joerg Palm, Munich (DE); Martin Fuerfanger, Steinhoering (DE); Mike Verdenhalven, Torgau (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 1069 days.

(21) Appl. No.: 17/435,048

(22) PCT Filed: Oct. 29, 2019

(86) PCT No.: PCT/CN2019/113842
§ 371 (c)(1),
(2) Date: Aug. 31, 2021

(87) PCT Pub. No.: WO2020/155697
PCT Pub. Date: Aug. 6, 2020

(65) Prior Publication Data
US 2022/0158022 A1    May 19, 2022

(30) Foreign Application Priority Data

Jan. 31, 2019 (EP) .................................. 19154936

(51) Int. Cl.
*H10F 71/00* (2025.01)
*H01L 21/67* (2006.01)

(52) U.S. Cl.
CPC ...... *H10F 71/128* (2025.01); *H01L 21/67115* (2013.01)

(58) Field of Classification Search
None
See application file for complete search history.

(56) References Cited

U.S. PATENT DOCUMENTS

| 5,861,609 A | 1/1999 | Kaltenbrunner et al. |
| 2004/0087172 A1* | 5/2004 | Probst .................. H10F 71/00 438/717 |

(Continued)

FOREIGN PATENT DOCUMENTS

| CN | 1399798 A | 2/2003 |
| CN | 102318515 A | 1/2012 |

(Continued)

OTHER PUBLICATIONS

J. Palm, et al., CIS module pilot processing applying concurrent rapid selenization and sulfurization of large area thin film precursors, Thin Solid Films, 2003, pp. 514-522, 431-432.

*Primary Examiner* — Elizabeth M Kerr
(74) *Attorney, Agent, or Firm* — Bayramoglu Law Offices LLC

(57) ABSTRACT

An arrangement for heat treating a multilayer body, which arrangement comprises an energy source with at least one radiant heater for generating heating radiation, a multilayer body, and an intermediate element arranged between the energy source and the multilayer body. According to a first alternative, the intermediate element includes a surface element implemented in the form of a flexible film. According to a second alternative, the intermediate element includes a surface element implemented in the form of a flexible film or a rigid plate, wherein the surface element has a surface facing the energy source, which can be irradiated (Continued)

by the heating radiation and is mechanically supported by a supporting device in the direction toward the energy source.

9 Claims, 7 Drawing Sheets

(56) References Cited

U.S. PATENT DOCUMENTS

| | | | |
|---|---|---|---|
| 2012/0208377 A1* | 8/2012 | Timans | H01L 21/67115 |
| | | | 257/E21.333 |
| 2015/0171235 A1 | 6/2015 | Saint Gobain | |

FOREIGN PATENT DOCUMENTS

| | | |
|---|---|---|
| CN | 103733368 A | 4/2014 |
| CN | 104919580 A | 9/2015 |
| CN | 104937706 A | 9/2015 |
| CN | 107507878 A | 12/2017 |
| EP | 0399662 A2 | 11/1990 |
| EP | 2360720 A1 | 8/2011 |
| JP | S61129834 A | 6/1986 |
| JP | 2003519441 A | 6/2003 |
| JP | 2006196593 A | 7/2006 |
| WO | 0109961 A2 | 2/2001 |

\* cited by examiner

ARRANGEMENT, DEVICE, AND METHOD FOR HEAT TREATING A MULTILAYER BODY

CROSS REFERENCE TO THE RELATED APPLICATIONS

This application is the national phase entry of International Application No. PCT/CN2019/113842, filed on Oct. 29, 2019, which is based upon and claims priority to European Patent Application No. 19154936.9, filed on Jan. 31, 2019, the entire contents of which are incorporated herein by reference.

TECHNICAL FIELD

The present invention is in the technical area of the production of thin-film solar modules and relates to an arrangement, a device, and a method for the thermal treatment of a multilayer body for a thin-film solar module.

BACKGROUND

Photovoltaic layer systems for the production of thin-film solar modules are well known to the person skilled in the art. The materials of the layers, in particular the semiconducting material of the absorber layer used for the photoelectric conversion, are selected such that the incident sunlight can be converted into electric current with satisfactory efficiency. Due to the physical properties and the technical handling qualities, absorber layers made of amorphous, micromorphous, or polycrystailine silicon, cadmium telluride (CdTe), gallium arsenide (GaAs), copper indium/gallium diselenide/disulfide/disulfoselenide (Cu(In,Ga) (S,Se) 2), copper zinc tin sulfoselenide (CZTS from the kesterite group) and organic semiconductors are particularly well suited. The pentenary semiconductor Cu(In,Ga) (S,Se)2/ which belongs to the group of chalcopyrite compound semiconductors, has gained special significance in the industrial series production of thin-film solar modules.

A possible method for producing absorber layers made of Cu(In,Ga) (S,Se)2 consists of a two-stage process. Such two-stage methods are known, for example, from J. Palm et al., "CIS module pilot processing applying concurrent rapid selenization and sulfurization of large area thin film precursors", Thin Solid Films 431-432, pp. 514-522 (2003). In a first stage, a precursor is deposited and then, in a second stage, heat-treated. As a result of the heat treatment (RTP=Rapid Thermal Processing), crystal formation and phase transformation of the precursor occur to form the semiconductor layer.

The heat treatment of the coated substrate is done, for example, in in-line systems, in which the coated substrate is fed to successive different chambers that are arranged along a processing route. In a typical configuration, such an in-line system comprises a loading station, heating chambers in which the coated substrates are preferably heated with heating rates of several ° C./s, as well as cooling chambers in which the coated substrates are cooled and moved out of the system.

The heat treatment of the coated substrate is a cost-intensive and technically demanding process that requires high temperatures, a precise temperature progression, and a defined composition of the process atmosphere if high levels of efficiency are to be obtained with sufficiently good reproducibility. Thus, for example, in the production of high quality Cu(In,Ga) (S,Se)2 compound semiconductors, the vapor pressure and the amount of selenium (Se) in the process atmosphere must be well-controlled. A sufficient amount of Se is necessary to ensure complete selenization of the metallic precursor. Significant Se loss would result in incomplete conversion of the precursor to the compound semiconductor. Even a small Se loss can still result in recombination, i.e., loss of efficiency and increased transients (in particular damp heat losses) in the finished thin-film solar module.

For better control of the parameters of the heat treatment process, it is known to limit the processing space for the coated substrate by a process box. By this means, the partial pressure of the readily volatile chalcogen components such as selenium or sulfur can be kept as constant as possible during the heat treatment. In addition, the exposure of the process chamber to corrosive gases is reduced. Selenium and sulfur are extremely corrosive substances that strongly attack metals at the high temperatures required during the heat treatment.

The heating of the coated substrate is typically done by electrically operated radiant heaters that are arranged lid-side and bottom-side in the process box, with the heating radiation (visible light to infrared) aimed at the lid and the bottom of the process box. Glass ceramic plates have proven themselves for the lid and the bottom since they are resistant to high temperatures, insensitive to temperature gradients, and inert to corrosion by selenium or sulfur, have a very low coefficient of expansion, and have high mechanical stability. The frame is typically made of graphite or a composite material such as a carbon fiber-reinforced carbon (reinforced carbon (CFRC=carbon-fiber-reinforced carbon, RCC=reinforced carbon carbon, CFC=carbon fiber carbon composite).

Although the use of a process box enables reliable production of high quality absorber layers, energy consumption is relatively high with this production process since not only the coated substrate but also the process box is heated. With 4-mm-thick plates in each case for the bottom and the lid, their mass alone is in each case already four times that of the coated substrate. In the case of a substrate with a size of approx. 1 $m^2$ (5 kg at a thickness of 2 mm), the total weight of the process box with the frame is approx. 40 kg. This mass is heated during the thermal conversion of the precursor to processing temperature and must then be cooled again. This is disadvantageous since, for sustainable and economical production of thin-film solar modules, it is desirable to keep energy consumption as low as possible.

In addition, general requirements for a process box must be met, namely, fast energy input into the interior that enables heating rates of the precursor of multiple ° C./s, as well as sufficient mechanical robustness to ensure the transport of a coated substrate (typically approx. 5 kg/$m^2$) and to withstand slight positive or negative pressures during rinsing and pumping processes and during convective cooling. The mechanical loads are on the order of as much as 40 kg/$m^2$ (excluding its own weight). In particular, the loads require high flexural strength of the material used. Furthermore, the process box must be sufficiently stiff mechanically such that the volume of the processing space does not change significantly, for example, due to elastic or plastic deformation during the heat treatment of the coated substrate.

SUMMARY

The present invention targets the above objects, intending to advantageously improve the devices known in the prior art for heat treating coated substrates such that energysaving and economical production of thin-film solar modules with reproducible high efficiency levels is reliably enabled.

These and other objects are accomplished according to the proposal of the invention by an arrangement, a device, and a method for heat treating a multilayer body with the features of the independent and coordinate claims. Preferred embodiments are evident from the dependent claims.

According to the invention, an arrangement and a device for heat treating a multilayer body are presented. In the context of the invention, the expression "multilayer body" describes a substrate, e.g., a glass substrate having one or a plurality of layers applied thereto, which are to be subjected to a heat treatment.

The multilayer body is used for producing a thin-film solar module. Preferably, it is a thin-film solar module with a composite pane structure that has a cover plate and a back substrate (e.g., glass plates) that are fixedly bonded to one another via a thermoplastic or cross-linking polymeric intermediate layer (e.g., PVB or EVA). The invention relates in particular to a multilayer body for a thin-film solar module in substrate configuration, in which the layer structure for producing the solar cells is applied to a surface of the back substrate facing the light-entry side, or in superstrate configuration, in which the layer structure is applied to a surface of the transparent cover plate facing away from the light-entry side.

In keeping with the customary usage, the term "thin-film solar module" refers to modules with a layer structure with a low thickness of, for example, a few microns, that require a carrier for sufficient mechanical strength. The carrier can, for example, be made of glass, plastic, metal, or a metal alloy and, depending on the respective layer thickness and the specific material properties, can be designed as a rigid plate or a flexible film.

In a thin-film solar module, the layer structure comprises, in a manner known per se, a back electrode layer, a front electrode layer, and a photovoltaically active absorber layer arranged between the back and front electrode layer. The front electrode layer is optically transparent since passage of light to the layer structure must be enabled. The front electrode layer includes or is typically made of a doped metal oxide (TCO=transparent conductive oxide), for example, n-conductive, in particular aluminum-doped, zinc oxide (AZO).

Preferably, the multilayer body has a layer stack (precursor) for producing a chalcogen-containing semiconductor material. The elements of the sixth main group of the periodic table are referred to as chalcogens. The semiconductor material of the absorber layer contains at least one chalcogen, preferably sulfur and/or selenium. This is, particularly preferably, a chalcogen-containing chalcopyrite compound semiconductor, which is advantageously a ternary I-III-VI-compound semiconductor from the group copper indium/gallium disulfide/diselenide, abbreviated by the formula $Cu(In,Ga)(S,Se)_2$. In the preceding formula, indium and gallium can each be present alone or in combination. The same also applies to the chalcogens sulfur and selenium, each of which can be present alone or in combination. Particularly suitable as material for the absorber layer are CISe (copper indium diselenide), CIS (copper indium disulfide), CIGSe (copper indium gallium diselenide), CIGS (copper indium gallium disulfide), or CIGSSe (copper indium gallium disulfoselenide). Equally preferably, the multilayer body can have a layer stack (precursor) for producing a chalcogen-containing kesterite compound semiconductor, preferably copper zinc tin sulfoselenide (CZTS). The chalcogen-containing kesterite compound semiconductor contains at least one chalcogen, preferably sulfur and/or selenium.

Expediently, a $Cu(In,Ga)(S,Se)_2$ absorber layer is produced on a substrate in a two-stage RTP process. Here, after producing a back electrode layer on the substrate, a precursor layer is first applied on the back electrode layer. The precursor layer, which can comprise one or a plurality of plies, contains the elements copper, indium, and gallium, which are preferably applied by sputtering. The precursor layer further includes at least one chalcogen in elemental form, preferably selenium and/or sulfur, which is preferably applied by thermal evaporation. During these deposition processes, the temperature of the carrier is typically below 100° C. such that the elements remain substantially unreacted as a metal alloy and an elemental chalcogen (selenium and/or sulfur). Then, the precursor layer is reacted by heating in an atmosphere containing at least one chalcogen (selenium and/or sulfur) to form a $Cu(In,Ga)(S,Se)_2$ compound semiconductor (thermally reacted). For example, the precursor layer contains only elemental selenium as a chalcogen and the thermal conversion of the precursor layer is done in an atmosphere that contains only sulfur as a chalcogen. As a result of the heat treatment of the precursor layer, crystal formation and phase transformation of the precursor layer occur to form the semiconductor layer (compound semiconductor). Similarly, a chalcogen-containing kesterite compound semiconductor can be produced in a two-stage process, wherein, first, a precursor layer is applied on the back electrode layer, which contains copper, zinc, tin, and at least one chalcogen (preferably sulfur and/or selenium, particularly preferably only selenium). Then, the precursor layer is reacted by heating in an atmosphere that contains at least one chalcogen (preferably sulfur and/or selenium, particularly preferably only sulfur), to form the compound semiconductor.

The arrangement according to the invention for heat treating a multilayer body includes an energy source with at least one radiant heater (e.g., a radiator bank with a one- or two-dimensional arrangement of radiant heaters) for generating heating radiation, a multilayer body, as well as an intermediate element arranged between the energy source and the multilayer body element, on which the heating radiation impinges. Preferably, the intermediate element is arranged immediately adjacent the energy source. Accordingly, the heating radiation impinges directly on the intermediate element or at least one or more sections of the intermediate element. Preferably the intermediate element is arranged immediately adjacent the multilayer body so that there is no physical object such as a layer or plate present between the intermediate layer and the multilayer body.

According to a first alternative, the intermediate element includes a surface element implemented in the form of a flexible film. According to a second alternative, the intermediate element includes a surface element that is implemented in the form of a flexible film or a rigid plate, wherein, on a side of the surface element facing the energy source, a supporting device for mechanically supporting the surface element in the direction toward the energy source is arranged. Specifically, a surface of the surface element facing the energy source, which can be irradiated by the heating radiation of the energy source, is supported mechanically by the supporting device in the direction of the energy source. For example, the intermediate element consists of only the surface element or is composed of the surface element and the supporting device. The intermediate element is arranged between the energy source and the multilayer body. Accordingly, the supporting device is arranged on the side of the intermediate element facing away from the multilayer body.

In the context of the present invention, the term "surface element" refers to a flat-planar body, for example, with a rectangular shape. The surface element has a first surface facing the energy source, which can be irradiated directly by the heating radiation of the energy source. The surface directly radiated by the heating radiation can equal the first surface of the surface element, but can also be smaller. Opposite the first surface, the surface element has a second surface facing away from the energy source, which can serve as the bottom and as a support surface for the multilayer body during use of the intermediate element.

In the arrangement according to the invention for heat treating a multilayer body, the energy source and the intermediate element are arranged such that the multilayer body can be heated directly by heating radiation (in the case of a surface element that is transparent or partially transparent to the heating radiation) or indirectly by the heated surface element (in the case of a surface element that is opaque to the heating radiation). In the case of direct heating, at least part of the heating radiation of the energy source passes through the surface element and impinges on the multilayer body, as a result of which the multilayer body is heated. In the case of indirect heating, the surface element is heated by the impinging heating radiation of the energy source and transfers the heat to the multilayer body via thermal radiation and thermal conduction. If the surface element is opaque, heating of the multilayer body is done substantially indirectly through the heated surface element by means of thermal radiation and thermal conduction. The surface element preferably has low reflectivity and high emissivity such that the radiation emitted by the radiator bank is absorbed to the greatest extent possible.

In the context of the present invention, the term "transparency" or "transparent" refers to permeability for heating radiation of at least 85%, in particular at least 90%, preferably at least 95%, in particular 100%. The term "opacity" or "opaque" refers to permeability for heating radiation of less than 5%, in particular 0%. The term "partial transparency" or "partially transparent" refers to permeability for heating radiation that is between the those of opacity and transparency.

The surface element is, according to the first alternative, implemented as a flexible film or, according to the second alternative, implemented as a flexible film or a thin rigid plate with a mechanical supporting device. According to the invention, the intermediate element can be implemented such that it has a lower mass than intermediate elements used in the prior art, advantageously enabling a significant savings of energy costs in the heat treatment of the multilayer body. Since the surface element can be very thin, even opaque materials can also be used for the surface element, since the desired high heating rates of several ° C. per second can be achieved only with very thin surface elements.

Preferably, the surface element has such a (low) thickness that a shape factor, resulting from the quotient of thickness/diagonal of the surface element, is less than 4 mm/i m, i.e., less than $4 \times 10^{-4}$. Here, a rectangular surface element with a diagonal of the first surface facing the energy source is considered. Preferably, the surface element has such a thickness that the shape factor is less than $5 \times 10^{-4}$. This is true, in particular, for the case in which the transmittance of the surface element is less than 20%, less than 5%, or less than 1%, enabling fast heating rates of the multilayer body.

When the transmittance of the surface element is greater than 50% or even greater than 70%, the shape factor can also be greater.

Preferably, the thickness of the surface element is less than 4 mm, more preferably less than 1 mm, even more preferably less than 0.5 mm.

Preferably, the total mass of the intermediate element is selected such that it is less than 400%, preferably less than 200%, more preferably less than 100%, even more preferably less than 50%, most preferably less than 10%, of the mass of the multilayer body. This can result in a significant savings in energy costs with the heat treatment of the multilayer body.

If the surface element is implemented in the form of a non-dimensionally stable, i.e., a flexible, film, the thickness of the film is preferably less than 0.5 mm, more preferably less than 0.3 mm.

Preferably, the film contains or is made of graphite with or without a corrosion inhibitor that is tear and corrosion resistant. Preferably, the film contains or is made of a composite material, such as a carbon fiber-reinforced carbon. It is also possible for the film to be a metal foil coated on one or both sides with a corrosion protection layer. The coating of the metal foil is thus corrosion resistant at high temperatures. An example of this is a molybdenum foil coated on both sides with, for example, a 20-to-1000-nm-thick molybdenum nitride (MoN) layer, which serves as a corrosion protection layer. Also possible are other ceramic corrosion protection layers made, for example, of SiC, $Al_2O_3$, TiN, etc. Metal foils are very stable mechanically in terms of flexural strength and tear resistance. Consequently, they can be very thin. The high thermal conductivity ensures homogeneous temperature distribution. The emissivity of the metal foils should be as high as possible as result of their coating or surface roughness and their reflectivity should be very low. Corrosion resistance is ensured by the corrosion protection layer.

As an alternative to coated metal foils, composite films are also suitable, for example, a metal foil that is bonded to one or both sides of a graphite film by an adhesive (e.g., a ceramic adhesive or a graphite adhesive. The graphite film assumes the function of sealing and corrosion stability. The mechanical stability is achieved by the metal foil.

If the surface element is implemented in the form of a rigid plate, the thickness of the plate is preferably less than 4 mm, more preferably less than 1 mm, even more preferably less than 0.5 mm. Preferably, the plate contains or is made of glass ceramic, carbon fiber-reinforced carbon, or a glass with a high softening point (typically higher than 800° C.), such as borosilicate glass, aluminosilicate glass, or quartz glass.

The surface element implemented in the form of a flexible film or a rigid plate preferably has low reflectivity and high emissivity such that the radiation emitted by the energy source is absorbed to the greatest extent possible. Preferably, the surface element toward the energy source has reflection of less than 10%, more preferably less than 5%, and at best less than 2% (the percentage data are based on the share of reflected heating radiation).

The second surface of the surface element implemented in the form of a flexible film or a rigid plate, which can serve as a support surface for a multilayer body, is preferably patterned with elevations such that the contact area with the multilayer body is as small as possible. Thus, the influence of thermal conduction is suppressed. Thermal conduction can result in a spatially very inhomogeneous heating if the multilayer body bulges during heating or is not completely planar as a result of preliminary processes. The patterning can be done by roughening, local decoating, or coating. The patterning comprises elevations that can be implemented as random and/or periodic patterns, whose dimension perpendicular to the surface element (height) is preferably in the range from one to several hundred microns.

The supporting device is implemented such that it mechanically supports the surface element or the first surface of the surface element in the direction toward the energy source (on the side of the intermediate element facing away from the multilayer body). For this purpose, the supporting device is arranged between the surface element and the energy source, with the energy source being arranged on the side of the surface element facing away from the multilayer body. The supporting device preferably does not support the surface element over its full surface, in other words, a contact area of the supporting device, in which the supporting device makes touching contact with the first surface is smaller than the first surface. In particular, the supporting device is thus not implemented in the form of a layer or coating that is applied on the first surface of the surface element. Preferably, the supporting device extends over the whole (complete) surface element or first surface, respectively, but does not fully cover the surface element or first surface, respectively. In other word, although the supporting device extends over the whole first surface, the first surface has one or more portions not covered by the supporting device. Specifically, the supporting device supports the first surface in an inner portion surrounded by a circumferential edge portion of the first surface. In particular, the supporting device supports the first surface in a central (middle) section thereof.

Preferably, the supporting device covers less than 10% of the first surface of the surface element (in perpendicular view through the surface element) such that there is only slight shading of the heating radiation impinging on the surface element due to the supporting device. The multilayer body can thus be heated homogeneously and only slight thermal inhomogeneities occur.

For example, the surface element and the supporting device have only loose touching contact, with the supporting device contacting the first surface of the surface element. Preferably, the surface element and the supporting device are fixedly connected to one another. For example, the supporting device is fixedly connected to the first surface of the surface element, for example, by an adhesive, preferably by a ceramic adhesive. Preferably, the supporting device is fixedly connected to the surface element only in places, in particular at points, in order to minimize an undesirable heat transfer (cold bridges).

The combination of the surface element and the supporting device enables, so to speak, a decoupling of the requirements on the intermediate element, on the one hand, to form a gas-tight processing space with low mass, and, on the other, to be sufficiently mechanically stable and adequately resistant against the corrosive substances occurring during the heat treatment. In particular, the surface element can be selectively optimized in terms of the gas-tight formation of the processing space with low mass and corrosion resistance, with sufficient mechanical stability ensured by the supporting device.

According to a preferred embodiment of the invention, the supporting device is implemented in the form of a grid of intersecting linear supporting elements which preferably extends over the complete (whole) surface element or first surface of the surface element, respectively. The grid has one or preferably a large number of meshes. Advantageously, the linear supporting elements in the grid are fixedly connected to one another. According to another preferred embodiment, the linear supporting elements are arranged in a line arrangement, which preferably extends over the complete (whole) surface element or first surface of the surface element, respectively, wherein the linear supporting elements are arranged side-by-side, in particular parallel. By means of the supporting device, on the one hand, good mechanical support of the surface element can be achieved. On the other, inhomogeneities during heating of the multilayer body are relatively low due to shielding of the heating radiation. Advantageously, the grid or the line arrangement extends over the entire first surface of the surface element (in perpendicular view through the surface element), without, however, having touching contact with the entire first surface.

Depending on the thickness of the linear support elements, their number can be suitably selected in light of the force absorption required for mechanical support, wherein either a smaller number of thicker support elements or a larger number of thinner support elements can be provided. The thinner the linear supporting elements, the smaller the possible shadows and temperature inhomogeneities caused thereby. The surface element implemented in the form of a film or a thin plate can be joined to the linear support elements, for example, by a ceramic adhesive.

Advantageously, the grid of linear support elements is a wire or rod grid, wherein the linear supporting elements can be made of metal or another material. Optionally, the linear supporting elements are made of metal coated with a corrosion protection layer. For example, the metal wires contain or are made of a molybdenum or tungsten alloy. For example, the ceramic corrosion protection layer contains or is made of $Al_2O_3$, $MoN$, $Si_3N_4$, or the like. Also possible would be production of the (wire) grid from glass fibers. The linear support elements can, for example, be made of graphite, metal, ceramic, glass ceramic, or a glass with a high softening point (typically above 800° C.), such as borosilicate glass, aluminosilicate glass, or quartz glass. They can also be made of a composite material such as carbon fiber-reinforced carbon.

The linear support elements are preferably implemented as wires or rods. In keeping with the common usage of the terms, rods differ from wires only by their larger cross-section.

The cross-section of the linear support elements is preferably round (circular or disk-shaped) or rectangular. In the case of linear support elements in rectangular shape (rods), it is preferred for the narrower surface to be parallel to the surface element (first surface). By means of a rectangular cross-section with the narrower side parallel to the surface element, high rigidity is achieved along with reduced shading. Depending on the material and the construction, the cross-section of the linear support elements can be circular (round wire or round rod), annular (tube), T-shaped (T-beam), or double T-shaped (double T-beam).

The linear support elements can be opaque, partially transparent, or transparent. Preferably, the linear supporting elements are at least partially transparent, i.e., partially transparent or transparent. Advantageously, the absorption of the heating radiation in the linear support elements is less than 50%, more preferably less than 20%, and is at best less than 5%. Due to the transparency, the shading of the heating radiation on the surface of the surface element (film or thin plate) is very low.

Since, due to a comparatively large mass, linear support elements can heat up more slowly than the surface element itself and since, in particular, opaque rods also cause a certain shading, it is advantageous to incorporate a thermal insulator between the linear supporting elements and the surface element. This prevents the connection point from acting as a heat sink. This could result in inhomogeneities in the radiation bank and thus, possibly, in the multilayer body as well. This is advantageously a ceramic adhesive. The attachment is preferably done in the form of points to reduce cold bridges.

The invention further relates to a device for heat treating a multilayer body that includes at least one arrangement for heating a multilayer body implemented as described above.

The device for heat treating a multilayer body includes a setup for forming a (reduced) processing space for a multilayer body. The processing space is reduced relative to the chamber volume of a chamber (heating or cooling chamber) in which the setup for forming a reduced processing space is situated. The setup for forming a processing space comprises a bottom-side section, hereinafter referred to as "the bottom", a lid-side section hereinafter referred to as "the lid", and at least one frame, which, together, form a processing space for accommodating the multilayer body, which is gas-tight at least during the heat treatment. The frame connects the bottom and the lid to one another and simultaneously serves as a spacer between the lid and the bottom. The frame is made, for example, of graphite or composite material such as carbon fiber-reinforced carbon.

In the context of the present invention, "gas tightness" means that the processing space does not necessarily have to be closed. Instead, the processing space can even have one or a plurality of openings to the external surroundings, so long as a gas exchange between the processing space and the external surroundings during the heat treatment of a multilayer body is so low that the atmosphere in the processing space is not substantially affected by this.

This applies to the standard pressure customarily prevailing during heat treatment. If, however a positive or negative pressure is applied, the gas exchange is no longer negligible.

A multilayer body is or can be accommodated in the processing space. The lid and the bottom are each flat-planar sections of the setup for forming a processing space, for example, in a rectangular shape, which are arranged in the working position with their planes typically parallel to the horizontal. The frame is typically arranged circumferentially around the bottom or the lid. The frame wall is typically aligned perpendicular to the horizontal. Preferably, the multilayer body is mounted on the bottom.

The frame can be fixedly connected to the lid and is then referred to as the "lid frame". In this case, the frame is not fixedly connected to the bottom. Alternatively, the frame can be fixedly connected to the bottom and is then referred to as the "bottom frame". In this case, the frame is not fixedly connected to the lid. Alternatively, the setup for forming a processing space can include two frames, with a first frame fixedly connected to the lid (and not fixedly connected to the bottom) and referred to as the "lid frame", and a second frame fixedly connected to the bottom (and not fixedly connected to the lid) and referred to as the "bottom frame". The bottom frame and the lid frame are not fixedly connected or can be nondestructively detachably connected to one another. The bottom and the lid frames can be placed one atop the other or nested inside one another to form the processing space.

The device for heat treating a multilayer body further includes a first or lid-side energy source with at least one radiant heater that is arranged directly adjacent the lid, and a second or bottom-side energy source with at least one radiant heater that is arranged directly adjacent the bottom. The setup for forming a (reduced) processing space is situated between the lid-side energy source and the bottom-side energy source. The lid-side energy source and the bottom-side energy source include in each case at least one radiant heater for generating heating radiation that is suitable to heat the multilayer body situated in the processing space. Typically, the heating radiation has a wavelength in the visible light spectrum (380 nm to 780 nm) and in the infrared wavelength spectrum above that. The at least one radiant heater can be linear or sheet-shaped. For example, the lid-side energy source and the bottom-side energy source are implemented in each case in the form of a radiant heater bank with a one-dimensional or two-dimensional arrangement of radiant heaters.

In the device according to the invention for heat treating a multilayer body, the lid-side energy source, the lid as an intermediate element, and the multilayer body form a first arrangement for heat treating a multilayer body according to the present invention. Additionally, or alternatively, the bottom-side energy source, the bottom as an intermediate element intermediate element, and the multilayer body form a second arrangement for heat treating a multilayer body according to the present invention. For the case that the lid or the bottom are not part of the arrangement according to the invention for heat treating a multilayer body, they are made, for example, of a glass ceramic plate.

The lid-side energy source and the lid are arranged such that the multilayer body situated in the processing space can be heated directly by heating radiation (in the case of a lid that is transparent or partially transparent lid to the heating radiation) or indirectly by the heated lid (in the case of a lid that is opaque to the heating radiation). The lid-side energy source is thus not situated in the direct vicinity of the bottom. Correspondingly, the bottom-side energy source and the bottom are arranged such that the multilayer body situated in the processing space can be heated directly by heating radiation (in the case of a bottom that is transparent or partially transparent to the heating radiation) or indirectly by the heated bottom (in the case of a bottom that is opaque to the heating radiation). The bottom-side energy source is thus not situated in the direct vicinity of the bottom.

As described above, in the at least one arrangement, the intermediate element in particular can have a surface element implemented in the form of a flexible film. A supporting device is not required here. Alternatively, the surface element can have a film or a rigid plate as a surface element, with a mechanical supporting device additionally provided for supporting the surface element in the direction of the energy source.

According to a first variant of the device for heat treating a multilayer body, the setup for forming a processing space includes a single frame, which is in this case a lid frame fixedly connected to the lid. The lid includes a surface element that is arranged between the lid side energy source and the multilayer body situated in the processing space, hereinafter referred to as the "lid surface element", and a supporting device for the lid surface element, hereinafter referred to as the "lid support device".

According to a second variant of the device for heat treating a multilayer body, the setup for forming a processing space includes a single frame, which is in this case a bottom frame fixedly connected to the bottom. The bottom includes a surface element that is arranged between the bottom-side energy source and the multilayer body situated in the processing space, hereinafter referred to as the "bottom surface element", and a supporting device for the bottom surface element, hereinafter referred to as the "bottom support device".

According to a third variant of the device for heat treating a multilayer body, the setup for forming a processing space comprises a first frame and a second frame, wherein the first frame is a lid frame fixedly connected to the lid and the second frame is a bottom frame fixedly connected to the bottom. Corresponding with the first variant, the lid includes a lid surface element and a lid support device. Corresponding with the second variant, the bottom includes a bottom surface element and a bottom support device. The lid frame and the bottom frame are not fixedly connected to one another and can be nondestructively detachably connected to one another. In particular, the lid frame and the bottom frame can be placed one atop the other or nested inside one another.

The lid surface element is opaque, partially transparent, or transparent to the heating radiation of the lid-side energy source. The bottom surface element is opaque, partially transparent, or transparent to the heating radiation of the bottom-side energy source.

The lid surface element and the bottom surface element are in each case flat-planar bodies, which, viewed from above toward the plane, are, for example, rectangular. The lid surface element forms the lid flat and serves to seal the processing space. It has an outer lid surface facing the energy source of the lid-side and an inner lid surface facing the processing space. The bottom surface element forms the bottom flat and likewise serves to seal the processing space. It has an outer bottom surface facing the bottom-side energy source and an inner bottom surface facing the processing space. Advantageously, the multilayer body rests on the inner bottom surface. Preferably, the bottom surface element or the inner bottom surface is patterned with elevations such that the contact area with the multilayer body is as small as possible. Thus, the influence of thermal conduction is suppressed. Thermal conduction can result in spatially very inhomogeneous heating if the multilayer body bulges during heating or is already not completely planar due to preliminary processes. The patterning can be done by roughening or coating with patterns in the range from one to several hundred microns.

The lid support device is implemented such that it mechanically supports the lid surface element in the direction toward the lid-side energy source. The lid is arranged for this purpose between the lid surface element and the lid-side energy source. Preferably, the lid support device is arranged on the outer lid surface, advantageously in touching contact with the outer lid surface. Advantageously, the lid support device is not situated inside the processing space. The lid support device does not support the lid surface element over its full surface. Instead, the lid support device supports the lid surface element only in regions, i.e., only in one or more regions of the lid surface element. Thus, the full surface of the lid surface element is not supported. Preferably, the lid support device covers less than 10%, more preferably less than 5%, and, at best, less than 2%, of the outer lid surface (in perpendicular view through the lid surface element) such that there is only slight shading of the heating radiation impinging on the lid surface element due to the lid support device. Analogously, the bottom support device is implemented such that it mechanically supports the bottom surface element in the direction towards the bottom-side energy source. For this purpose, the bottom support device is arranged between the bottom surface element and the bottom-side energy source. Preferably, the bottom support device is arranged on the outer bottom surface, advantageously in touching contact with the outer bottom surface. Advantageously, the bottom support device is not situated inside the processing space. Also, the bottom support device does not support the bottom surface element over its full surface, but only in regions, i.e., only in one or more regions of the bottom surface element. Preferably, the bottom support device covers less than 10%, more preferably less than 5%, and, at best, less than 2%, of the outer bottom surface (in perpendicular view through the bottom surface element) such that there is only slight impairment of the heating radiation impinging on the bottom surface element due to the bottom support device.

The design of the lid and/or the bottom of the setup for forming a (reduced) processing space as an intermediate element of the arrangement according to the invention for heat treating a multilayer body advantageously enables reducing the total mass of the setup for forming a processing space by reducing the mass of the intermediate element, without impairing its mechanical stability. Since, as a result, during the heat treatment of the multilayer body situated in the processing space, less mass of the setup for forming a processing space is also heated (or cooled), energy costs can be saved to a significant extent. Since the intermediate element is not supported by the associated supporting device over its full surface, but is supported only in regions, the unobstructed path of the heating radiation to the surface element is impaired only a little such that the multilayer body can be heated homogeneously over its entire surface and only slight thermal inhomogeneities occur. The surface element (lid or bottom) can be selectively optimized in terms of the gas-tight implementation of the processing space with low mass and corrosion resistance, while sufficient mechanical stability is ensured by the supporting device.

The surface element can have, with implementation as a thin rigid plate, in particular a thickness measured perpendicular to the surface plane, with which, without a mechanical support device, breakage is likely or at least deflection perpendicular to the surface plane occurs that is no longer acceptable in light of the high quality requirements (elastic deflection of more than 2 mm per square meter), due to its own weight (lid) or due to its own weight plus the weight of the multilayer body and possibly the weight of the lid and the frame (bottom). With a supporting device, the deflection of the surface element is preferably less than 1 mm.

The invention further extends to a method for heat treating a multilayer body, that comprises:

Providing the multilayer body in a device as described above for heat treating a multilayer body, Irradiating the multilayer body with heating radiation aimed at the lid and the bottom.

For the embodiment of the device for heat treating a multilayer body for carrying out the method according to the invention, reference is made to the statements made above.

Furthermore, the invention extends to the use of the method according to the invention for heat treating a multilayer body for producing an absorber during production of thin-film solar cells.

The various embodiments of the invention can be realized individually or in any combinations. In particular, the features mentioned above and to be explained in the following can be used not only in the combinations indicated, but also in other combinations or in isolation, without departing from the scope of the present invention.

BRIEF DESCRIPTION OF THE DRAWINGS

The invention is now explained in detail with reference to the accompanying figures. They depict.

LIST OF REFERENCE CHARACTERS

Figure 1:
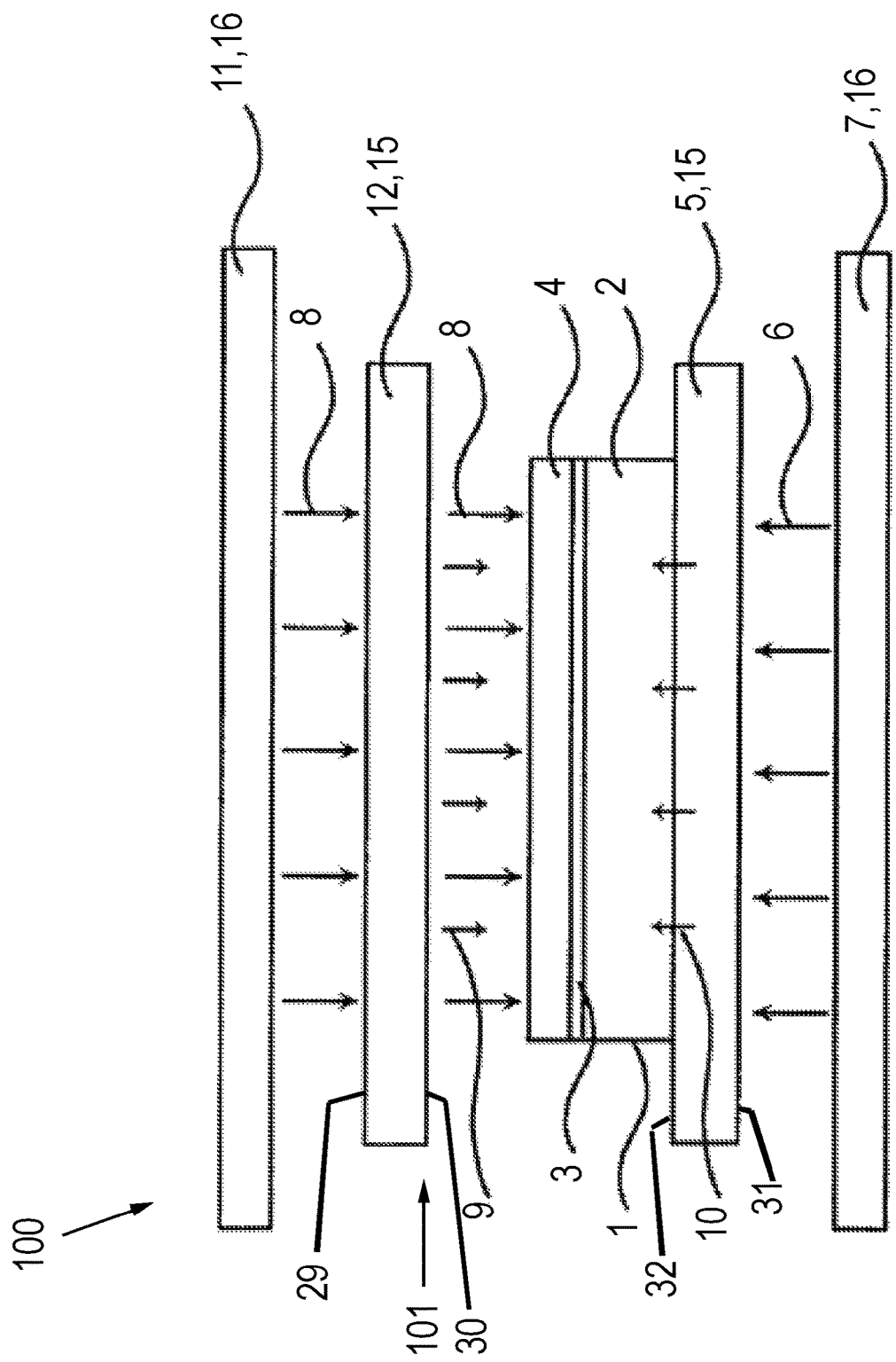
FIG. 1: a cross-sectional view of a device for heat treating a multilayer body for illustrating the thermal relationships during heating of the multilayer body.

1 multilayer body
2 substrate
3 back electrode layer
4 precursor layer
5 bottom
6 lower heating radiation
7 bottom radiator bank
8 upper heating radiation
9 thermal radiation
10 thermal conduction
11 lid radiator bank
12 lid
13 frame
14 processing space
15 intermediate element
16 energy source
17 surface element
18 film
19 plate
20 wire
21 connection point
22 supporting device
23 wire grid
24 rod
25 rod grid
26 line arrangement
27 first surface
28 second surface
29 outer lid surface
30 inner lid surface
31 outer bottom surface
32 inner bottom surface
100 device for heat treating a multilayer body 1
101 setup for forming a processing space 14
102 arrangement for heat treating a multilayer body 1

DETAILED DESCRIPTION OF THE EMBODIMENTS

Figure 2:
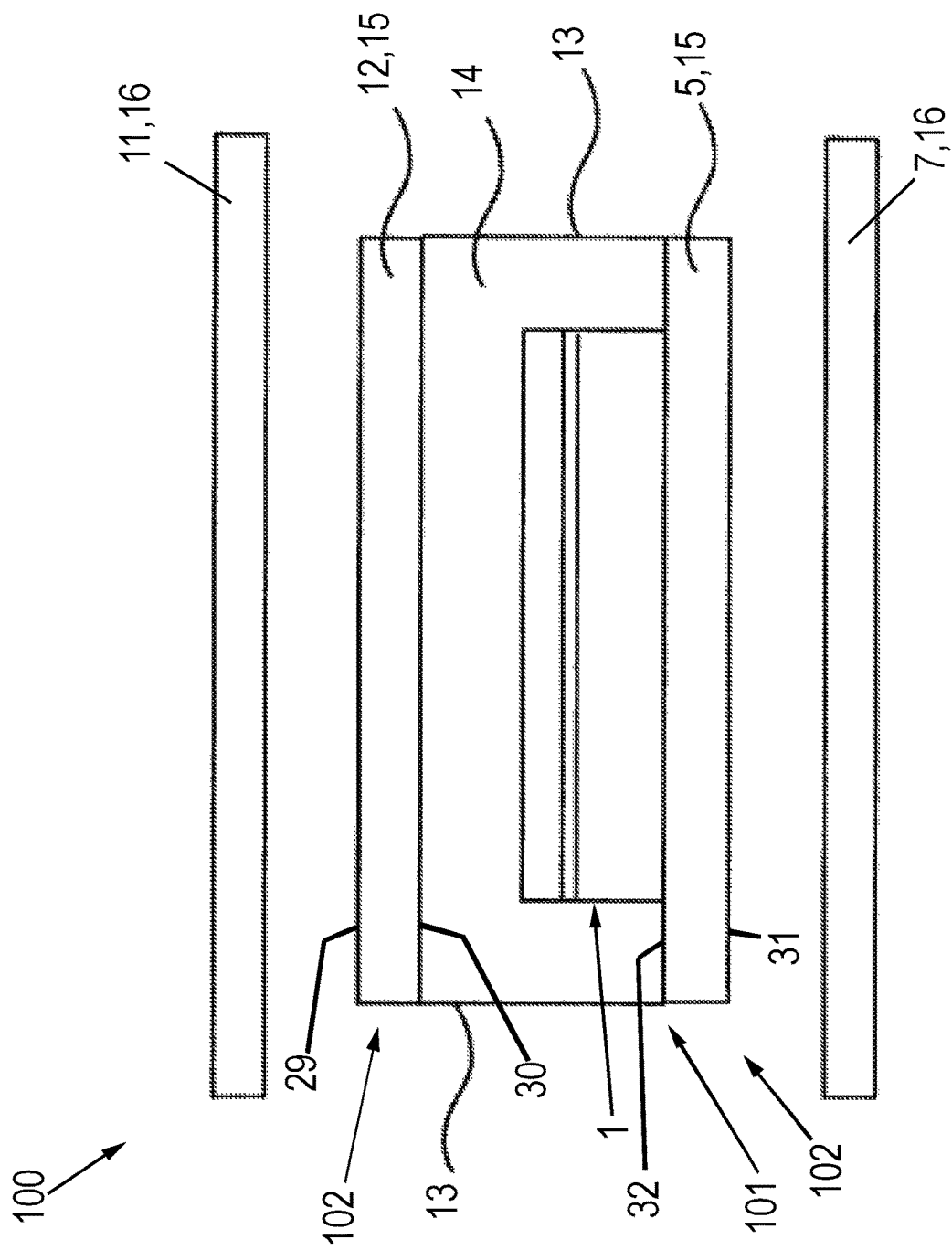
FIG. 2: a cross-sectional view of the device for heat treating a multilayer body of FIG. 1.

Consider first FIGS. 1 and 2 wherein a device referenced as a whole with the reference number 100 for heat treating a multilayer body 1 according to the present invention is illustrated schematically with reference to a cross-sectional view (section perpendicular to the substrate surface). FIG. 1 depicts the essential heating operations during the heat treating of the multilayer body 1; FIG. 2 depicts the structure during the heat treatment of the multilayer body 1.

The device 100 for heat treating a multilayer body 1 comprises a setup referenced as a whole with the reference number 101 for forming a (reduced) processing space. The setup 101 comprises a bottom 5, a lid 12, and a frame 13, which spatially connects the bottom 5 and the lid 12 to one another and, at the same time, serves as a spacer for the bottom 5 and the lid 12. The bottom 5, the lid 12, and the frame 13 form, together, a gas-tight processing space 14 (see FIG. 2), in which the multilayer body 1 can be subjected to a heat treatment. The multilayer body 1 rests here, for example, on the bottom 5.

The multilayer body 1 comprises a substrate 2, e.g., a glass plate, as well as a back electrode layer 3, e. g., made of molybdenum, applied on the substrate 2, and a precursor layer 4, which is to be thermally converted to form a compound semiconductor, applied thereon. For production of a Cu(In,Ga) (S,Se)2 absorber layer, the precursor layer 4 is made of various individual layers that contain copper, indium, and gallium, which are applied, for example, by sputtering. The precursor layer 4 further contains at least one chalcogen in elemental form, preferably selenium and/or sulfur, which is preferably applied by thermal evaporation. The precursor layer 4 is reacted (thermally converted) by heating in an atmosphere containing at least one chalcogen (selenium and/or sulfur) to the Cu(In,Ga)(S,Se)2 compound semiconductor. For example, the precursor layer 4 contains only elemental selenium as a chalcogen, and the thermal conversion of the precursor layer is done in an atmosphere that contains only sulfur as a chalcogen. The thermal conversion of the precursor layer 4 is done in the processing space 14.

Bordering and directly adjacent the lid 12, a lid radiator bank 11 having a plurality of radiant heaters (e.g., halogen lamps, infrared radiators, or surface radiators) placed in a one- or two-dimensional arrangement (array) is situated as a lid-side energy source for emitting heating radiation for the lid-side heating of the multilayer body 1. Analogously, bordering and directly adjacent the bottom 5, a bottom radiator bank 7 having a plurality of radiant heaters (e.g., halogen lamps, infrared radiators, or surface radiators) placed in a one- or two-dimensional arrangement (array) is situated as a bottom-side energy source for emitting heating radiation for the bottom-side heating of the multilayer body 1. The setup 101 for forming a processing space 14 is situated between the bottom radiator bank 7 and the lid radiator bank 11. Both the bottom 5 and the lid 12 can in each case be regarded, generally speaking, as an intermediate element 15 that is situated between an energy source 16 (the bottom radiator bank 7 or the lid radiator bank 11) and the multilayer body 1. The lid 12 has an outer lid surface 29 facing the lid radiator bank 11 and, opposite that, an inner lid surface 30 facing the multilayer body 1.

The bottom 5 has an outer bottom surface 31 facing the bottom radiator bank 7 and, opposite that, an inner bottom surface 32 facing the multilayer body 1. The multilayer body 1 preferably rests on the inner bottom surface 32.

As illustrated in FIG. 1, the radiant heaters of the lid radiator bank 11 emit the upper heating radiation 8, which impinges on the outer lid surface 29, partially passes through the (here, for example, partially transparent) lid 12 and impinges on the upper side of the multilayer body 1, i.e., on the precursor layer 4. The multilayer body 1 is in the region of the upper heating radiation 8. Part of the upper heating radiation 8 is absorbed by the 12 and heats the lid 12, which, in turn, emits the thermal radiation 9, which likewise heats the multilayer body 1. The radiant heaters of the bottom radiator banks 7 emit the lower heating radiation 6, which impinges on the outer bottom surface 31 of the (here, for example, partially transparent) bottom 5 and which heats the bottom 5. The bottom 5 passes on the energy to the multilayer body 1 by thermal conduction 10 and thermal radiation. Whereas the multilayer body 1 is heated from above primarily by the upper heating radiation 8, it is heated from below by thermal conduction 10 and thermal radiation of the heated bottom 5.

After the placing of the multilayer body 1 on the bottom 5, the processing space 14 is filled with the process gas and closed. Then, the temperature control is done at a rate of several ° C. per second, for example, 5° C./s, wherein the lid radiator bank 11 and the bottom radiator bank 7 can also be controlled separately for generating a specified heating output. As a result of the concomitant heating of the lid 12 and the bottom 5, condensation of volatile components of the atmosphere of the processing space 14 can be at least largely prevented.

Figure 3:
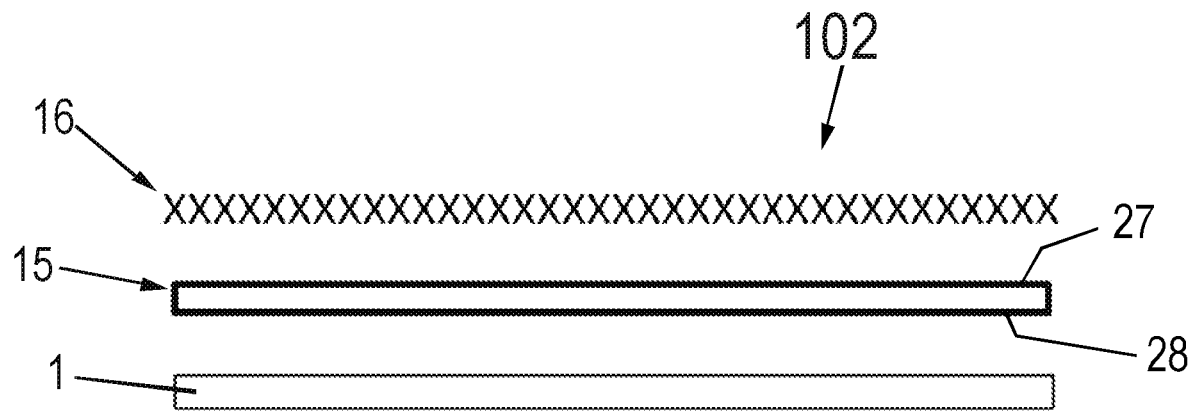
FIG. 3: a schematic representation of an arrangement consisting of an energy source, an intermediate element, and a multilayer body.

FIG. 3 depicts a schematic representation of an arrangement consisting of an energy source 16 (such as the bottom radiator bank 7 or the lid radiator bank 11), an intermediate element 15 (such as the bottom 5 or the lid 12), and the multilayer body 1, as also realized in FIGS. 1 and 2. The intermediate element has a first surface 27 facing the energy source 16 and a second surface 28 facing away from the energy source 16. The heating radiation of the energy source 16 impinges on the surface 27.

The heating energy that would be necessary to heat the multilayer body 1 to the desired temperature without the intermediate element 15 represents the minimum energy consumption EQ. The substantial source of loss when heating the multilayer body 1 is the energy $E_z = AQ$, which is necessary for heating the intermediate element 15, resulting from the formula:

$$E_z = \Delta Q = c^* M^* \Delta T$$

M is the mass, c the thermal capacity, $\Delta T$ the desired heating of the intermediate element 15.

The greater the mass M and the thermal capacity c of the intermediate element 15, the higher the energy loss $E_z$. The reduction of the mass M counteracts the mechanical load capacity. Thinner glass ceramic in the required size (e.g., 1-2 m) would bend (the bottom) too much or break already due to its own weight or due to the weight of the substrate+the bottom+the lid+the frame and the additional mechanical loads during transport and due to pressure differences. Thus, a mere reduction in the thickness of a glass ceramic intermediate element 15 is ruled out.

A stationary processing hood is not subject to such large temperature fluctuations as a transportable processing box if it is constantly in the radiation field of the radiant heaters. The stationary processing hood then hardly has the possibility of cooling down during the heating process and will, regardless of its mass, reach a temperature during stationary operation that results from the balance of energy input due to radiation of the radiant heaters and energy loss due to radiation, thermal conduction, and convection. If a stationary processing hood is used during heater-assisted cooling, it also cools down noticeably and is reheated with the next multilayer body. In contrast to this, the transportable process box has almost room temperature and must be reheated with the heat treatment of the multilayer body and cooled again to near room temperature.

It would be conceivable to use an intermediate element 15 with the greatest possible transparency such that the absorption of the heating power is very low. The above formula can be rewritten for this:

$$r = \Delta T / \Delta t = P_{abs} / (c^* M)$$

Here, r is the heating rate and Pg is the absorbed heating radiation. The equation can be used for both the intermediate element 15 and the multilayer body 1. Thus, the heating rate r increases with decreasing mass M and thermal capacity c. If, however, due to very low absorption, the absorbed radiation energy $P_{abs}$ is very low, the multilayer body 1 can be heated through the transparent intermediate element 15, without it also heating up to the same extent. In a continuous operation, the energy loss by heating the intermediate element 15 is a function of the absorption of the intermediate element 15, the mean heating power, and the cycle time, since each new substrate (multilayer body 1) again contributes via thermal radiation and thermal conduction to the cooling of the intermediate element 15. In the case of the mobile process box, there is also active cooling at the end of the process cycle.

There are, of course, glass ceramics with higher transparency; however, it has been demonstrated that the absorption is still so high that, over the entire process cycle, the glass ceramic heats up with a mobile process box to almost substrate temperature. Quartz is very expensive in the required sizes, if available at all. In addition, if the temperature of the intermediate element 15 is significantly colder than that of the substrate, selenium or other gaseous compounds with a lower melting point can condense there, at least temporarily. This results in a temporary chalcogen loss in a critical process phase. With increasing condensation, the absorption of the heating radiation in the condensates will increase. A stationary state will be established.

Here, the invention takes a different approach by significantly reducing the mass of the intermediate element 15 via an improved design and suitable thinner materials. As a result of the much lower mass of the intermediate element 15, even opaque materials can be used for this. The desired fast heating rates of typically 1 to 5° C./s can be achieved only through the use of very thin intermediate elements 15. In particular, the tasks of the gas-tight and corrosion-resistant sealing of the processing space and the mechanical stabilization due to the intermediate element 15 can be separated and optimized separately using a combination of a flat surface element and an associated supporting device.

Figure 4:
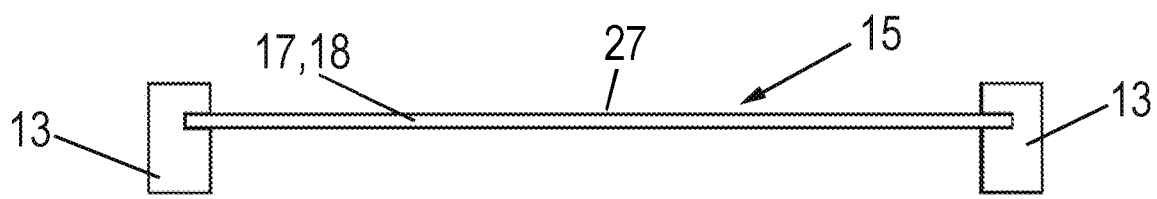
FIG. 4: an exemplary embodiment of an intermediate element in a cross-sectional view.
Figure 5:
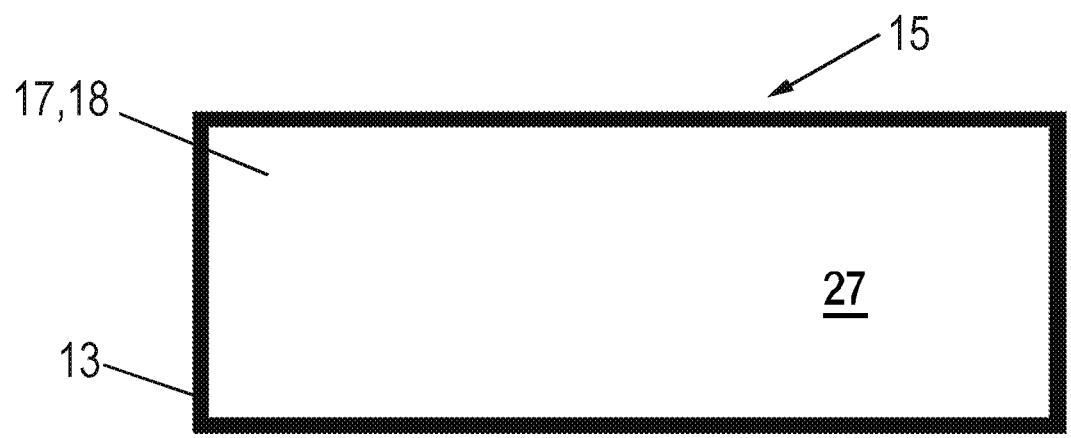
FIG. 5: the intermediate element of FIG. 4 in plan view.

This is explained in detail in the following. FIGS. 4 and 5 illustrate this with reference to a novel intermediate element 15, which can be used as the lid 12 and/or the bottom 5 of the device 100 for the heat treatment of a multilayer body 1 of FIGS. 1 and 2.

Accordingly, the intermediate element 15 is a surface element 17, implemented here, for example, in the form of a flexible film 18. FIG. 4 depicts a cross-sectional view (perpendicular to the plane of the surface element 17); FIG. 5 depicts a plan view. The film 18 is stretched within the frame 13, with the inner region of the frame 13 completely covered by the film 18. The film 18 is fixedly connected to the frame 13. The film 18 has a thickness of less than 0.5 mm, preferably less than 0.3 mm. The tensioning of the film 18 must be strong enough to be able to withstand mechanical loads. This applies in particular to the case in which the intermediate element 15 is used as the bottom 5, on which the weight of the multilayer body 1 and, possibly, the weight of the frame 13 and the lid 12 rests. As a result of pressure differences (during pump/flush cycles) and convective cooling, loads of as much as 40 kg/m² can occur. Materials used for the film 18, include, for example, graphite with or without a corrosion inhibitor or a composite material, for example, carbon fiber-reinforced carbon. Alternatively, a metal foil coated on one or both sides with a corrosion protection layer can be used. Another alternative is a composite film, in which a metal foil is bonded to one or both sides of a graphite film by means of a ceramic or graphite adhesive. Metal foils are extremely stable mechanically in terms of flexural strength and tear resistance such that they can be very thin. The high thermal conductivity ensures homogeneous temperature distribution. The graphite film provides corrosion stability. The foil preferably has low reflectivity and high emissivity such that the radiation emitted from the radiator bank is absorbed as much as possible.

When the film forms the bottom 5, the film is preferably patterned with elevations such that the contact area with the multilayer body 1 is as small as possible. Thus, the influence of thermal conduction is suppressed.

When both the lid 12 and the bottom 5 of the device 100 for heat treating a multilayer body 1 of FIGS. 1 and 2 are implemented in the form of the intermediate element 15 depicted in FIGS. 4 and 5, there are two frames 13, the which can be placed atop or within one another and are not fixedly connected to one another or are nondestructively detachably connected to one another.

Figure 6:
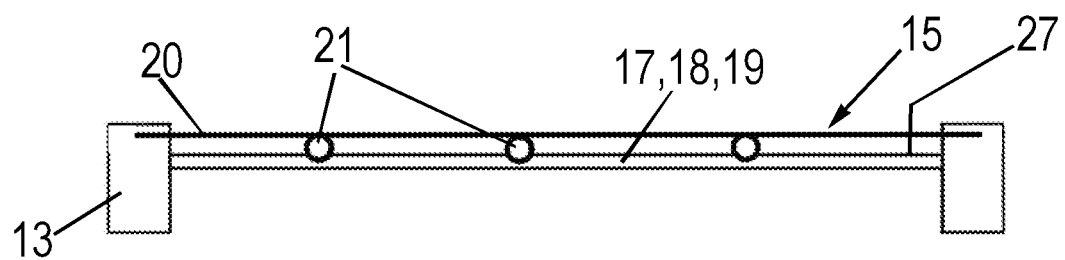
FIG. 6: another exemplary embodiment of an intermediate element in a cross-sectional view.
Figure 7:
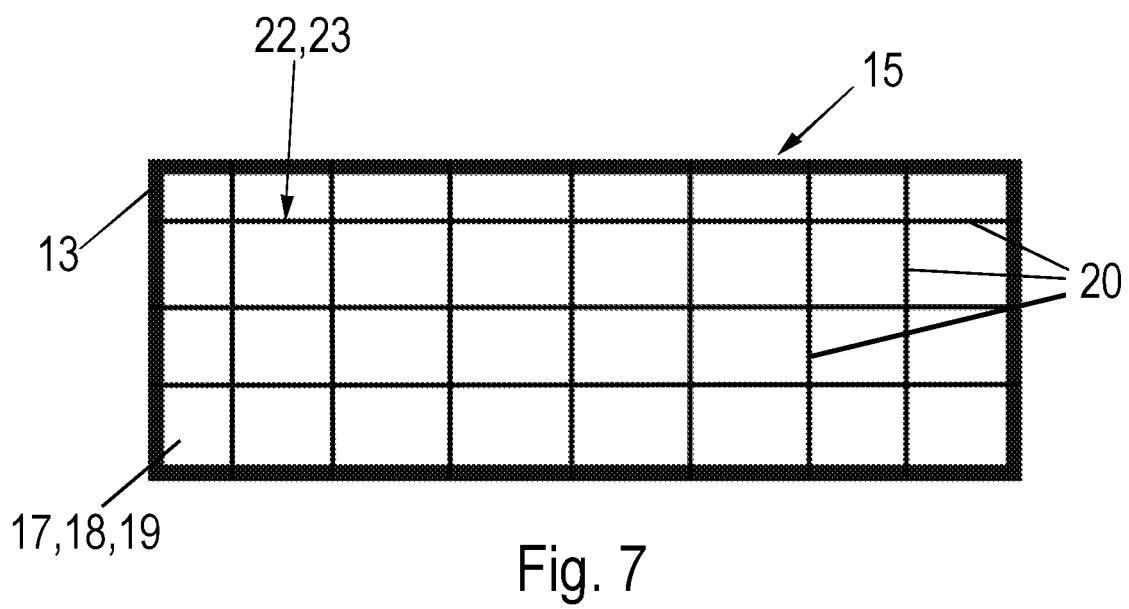
FIG. 7: the intermediate element of FIG. 6 in plan view.

FIG. 6 illustrates another exemplary embodiment of the intermediate element 15 using a cross-sectional view. The intermediate element 15 is a further development of the intermediate element 15 of FIGS. 4 and 5. FIG. 7 depicts a plan view of the intermediate element 15. In order to avoid unnecessary repetitions, only the differences relative to the exemplary embodiment of FIGS. 4 and 5 are described and, otherwise, reference is made to the statements above.

Accordingly, the intermediate element 15 includes a surface element 17 implemented as a flexible film 18 or as a rigid plate 19. Like the flexible film 18, the rigid plate 19 extends over the complete inner region of the frame 13. The intermediate element 15 further includes a supporting device 22, implemented here, for example, as a wire grid 23 The wire grid 23 is composed of a plurality of rectilinear wires 20 that intersect each other and are connected to each other. The intersecting wires 20 form a plurality of polygonal meshes. The wire grid 20 extends over the complete surface (i.e., first surface 27) of the surface element 17 within the frame 13. As can be seen in FIG. 6, the wire grid 23 is fixedly connected to the surface element 17 at connection points 21. For a fixed connection of the intermediate element 15 to the frame 13, the surface element 17 is fixedly connected to the frame 13 (e.g., clamped), with the supporting device 22 not fixedly connected directly to the frame 13. Alternatively, it would be possible for the supporting device 22 to be fixedly connected to the frame 13, whereas the surface element 17 is not fixedly connected to the frame 13. The surface element 17 is then clamped or fastened above the supporting device 22. In another alternative, it would be possible for both the surface element 17 and the supporting device 22 to be fixedly connected in each case directly to the frame 13. The supporting device 22 is arranged on the side of the surface element 17 facing the energy source 16, here, for example, in touching contact with the first surface 27 of the surface element 17. The supporting device 22 supports the surface element 17 flatly in the direction of the energy source 16 and ensures sufficient mechanical stability of the surface element 17.

The connection points 21 are made, for example, of an adhesive with low thermal conductivity, e.g., a ceramic adhesive. Since the connection points 21 fasten the surface element 17 to the wires 20, the surface element 17 does not necessarily have to be clamped in the frame 13, since the mechanical load is borne by the wires 20, The mechanical load is absorbed by the wires 20, with higher mechanical loads possible in terms of the weight and bending forces occurring, in comparison with the exemplary embodiment of FIGS. 4 and 5, in which the surface element 17 is not supported by a mechanical supporting device 22. The film 18 or thin plate 19 has to be attached to the frame 13 such that the processing space is sufficiently gas-tight.

The surface element 17 can be implemented as a rigid plate 19 with low thickness. A composite material, such as carbon fiber-reinforced carbon, glass ceramic, or a glass with a high softening point, such as a borosilicate glass, aluminosilicate glass, or quartz glass, can, for example, be used as the material. The plate 19 is thin and preferably has a thickness of less than 4 mm, more preferably less than 1 mm, even more preferably less than 0.3 mm.

The wires 20 are made of a metal, for example, a molybdenum or tungsten alloy. The wires 20 can additionally be coated with a corrosion protection layer made, for example, of $Al_2O_3$, MoN, $Si_3N_4$, or the like. If the thermal conductivity of the film 18 or the thin plate 19 is good, the shading due to the wires 20 will have hardly any influence on the radiation to the multilayer body 1. In this embodiment, the mass of the intermediate element 15 can be low. As a result of the composite technology, the requirements and the functions are divided between the two components: the film 18 or the thin plate 19 assumes the primary load of the corrosion resistance and the sealing; the wire grid 23 assumes the mechanical requirement in terms of tensile strength and flexural strength.

Figure 8:
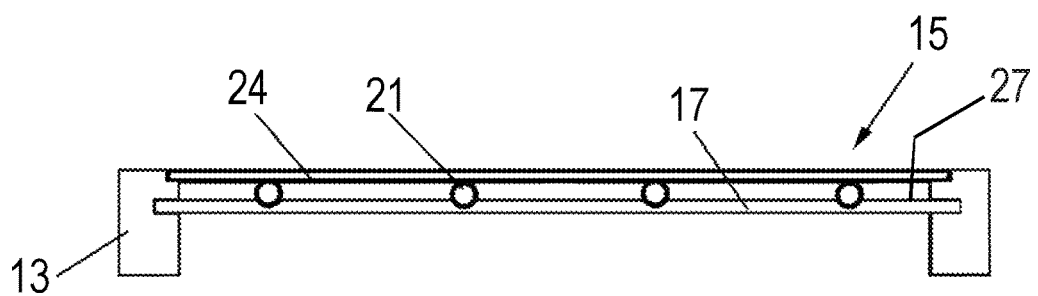
FIG. 8: another exemplary embodiment of an intermediate element in a cross-sectional view.
Figure 9:
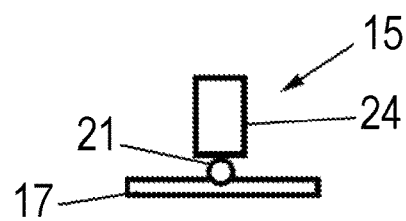
FIG. 9: another cross-sectional view of the intermediate element of FIG. 8.
Figure 10:
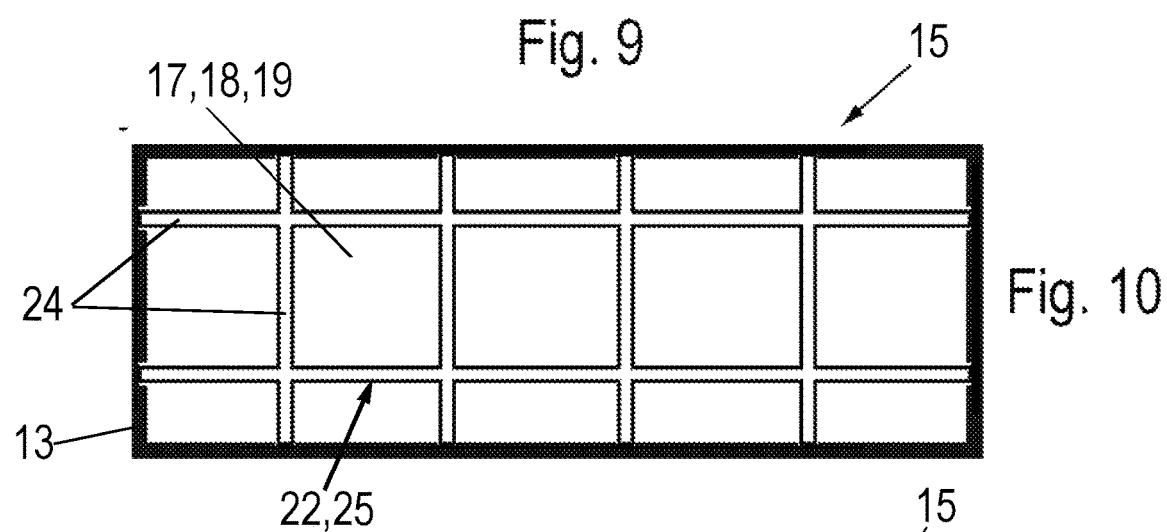
FIG. 10: the intermediate element of FIG. 8 in plan view.
Figure 11:
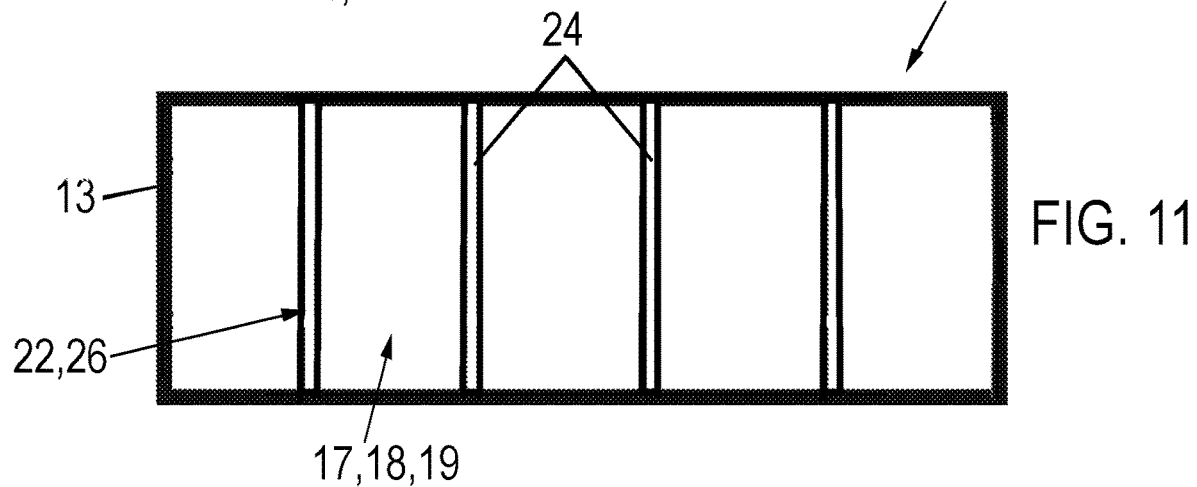
FIG. 11: the intermediate element of FIG. 8 in plan view in a variant.

Consider now FIG. 8 to 11, wherein another exemplary embodiment of the intermediate element 15 is illustrated. FIG. 8 depicts a cross-sectional view (perpendicular to the surface element 17); FIG. 9 likewise, a cross-sectional view (perpendicular to the surface element 17, but perpendicular to FIG. 8); FIG. 10, a plan view; FIG. 11, another plan view. In order to avoid unnecessary repetitions, only the differences relative to the exemplary embodiment of FIGS. 6 and 7 are described and, otherwise, reference is made to the statements above.

Accordingly, the intermediate element 15 comprises a supporting device 22, formed here, not by wires 20, but by rods 24. As depicted in the plan view of FIG. 10, the rods 24 can be arranged in the form of a rod grid 25 with intersecting rods 24, analogous to the wire grid 23. The rod grid 25 has a plurality of polygonal meshes. In an alternative embodiment, depicted in FIG. 11, the rods 24 are arranged in the form of a line arrangement 26 with rods 24 arranged parallel side-by-side. The rod grid 25 or the line arrangement 26 extends over the entire surface (i.e., the first surface 27) of the surface element 17 within the frame 13. As can be seen in particular in FIG. 9, the rods 24 are, in each case, fixedly connected to the surface element 17 at connection points 21.

The rods 24 are made, for example, of graphite, metal, ceramic, or glass ceramic. Preferably, the rods 24 have a rectangular cross-section. By means of a rectangular cross-section with the short sides parallel to the surface element 17, high rigidity can be achieved with reduced shading. The cross-section of the rods 24 can also advantageously be, depending on material and construction, circular (round rod), annular (tube), T-shaped (T-beam) or double-T-shaped (double-T-beam). The rods 24 are advantageously made of a partially transparent, more preferably a transparent material. Preferably, the absorption of the heating radiation in the rods 24 is less than 20%, preferably less than 10%, and even more preferably less than 5%. As a result of the transparency, the shading of the heating radiation on the surface element 17 is very low. The rods 24 will heat up via the heating radiation and thermal conduction over the duration of the process. However, depending on the construction, there may be a permanent temperature gradient between the surface element 17 and the rods 24.

Figure 12:
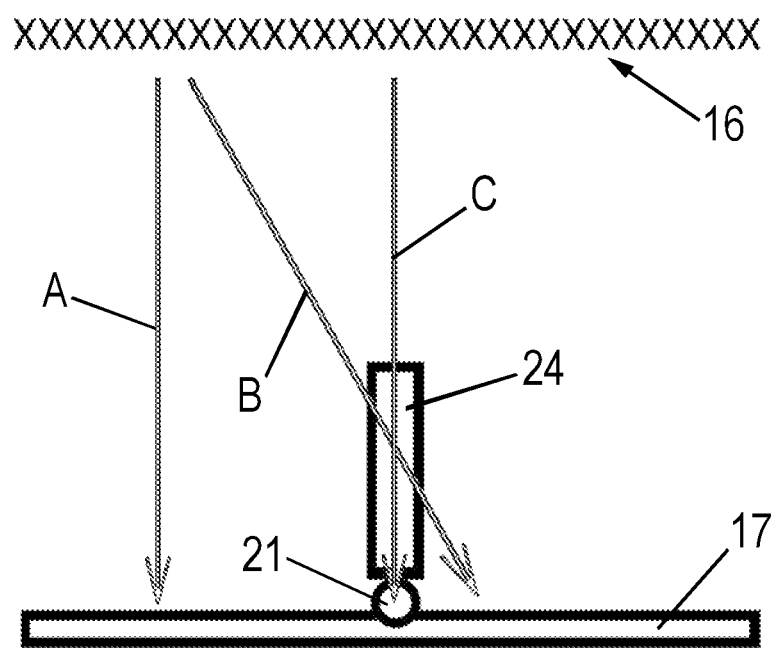
FIG. 12: the cross-sectional view of FIG. 9 with additions

FIG. 12 presents the energy source 16 with additions relative to FIG. 9. Discernibly, only very slight interference with the heating radiation 6, 8 occurs as a result of a transparent rod 24. The heating beam A impinging perpendicular to the surface (i.e., first surface 27) of the surface element 17 passes the rod 24 laterally. The heating beam C likewise impinging perpendicular to the surface of the surface element 17 can, for the most part, pass through the transparent rod 24. The heating beam B passing obliquely through the rod 24 can also impinge on the surface of the surface element 17.

When using rods 24, it is advantageous to incorporate a thermal insulator between the rods 24 and the surface element 17. This can advantageously be a ceramic adhesive. The fastening can also be done in the form of points to reduce cold bridges. If the thermal conductivity of the surface element 17 is high, but that of the connecting material is low, the effect of delayed heating can be minimized. The surface element 17 can be significantly stiffened by the rods 24 directed perpendicular to the plane of the surface element 17. The mechanical demands on the surface element 17 can thus be reduced such that the self-supporting surface between the rods 24 is significantly reduced. The spacing and the cross-section of the rods 24 should be optimized such that the flexural strength of the surface element 17 is sufficient to withstand the compressive loads on the self-supporting surface between two rod 24. The overall dimensions of number, spacing, and cross-section of the rods 24 should be selected only as large as necessary. Of course, the rods 24 perpendicular to the surface element 17 constitute a much better optimization of mass and stiffness than only a flat plate. The surface element 17 with a rod grid 25 or a line arrangement 26 of rods 24 forms a composite body with significantly higher stiffness and lower mass.

Figure 13:
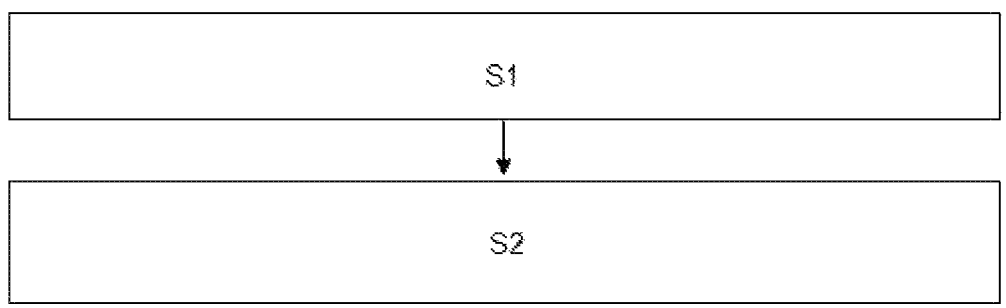
FIG. 13: a flowchart for illustrating the steps of the method according to the invention for heat treating a multilayer body.

FIG. 13 illustrates the method for heat treating a multilayer body 1. It comprises a first step SI, in which the multilayer body 1 is provided in a device 100 according to the invention 100 for heat treating a multilayer body 1, and a second step S2, in which the multilayer body 1 is irradiated with heating radiation on the bottom-side and the lid-side. The respective heating radiation impinges on the lid and the bottom of the setup for forming a (reduced) processing space.

The invention makes available an improved arrangement, device, and method for heat treating a multilayer body, wherein the mass at least of one intermediate element can be significantly reduced. The intermediate element has either a surface element implemented in the form of a flexible film, or a surface element that is implemented in the form of a flexible film or a thin rigid plate and is mechanically supported by a supporting device. As a result of the reduced mass, costs can be saved in the heat treatment of the multilayer body without compromising the mechanical stability and corrosion resistance of the intermediate element.

What is claimed is:

1. An arrangement for heat treating a multilayer body, comprising:
   an energy source with at least one radiant heater for generating heating radiation,
   a multilayer body,
   an intermediate element arranged between the energy source and the multilayer body, wherein the intermediate element comprises a surface element implemented in a form of a flexible film, the surface element has a surface facing the energy source, the surface element is irradiated by the heating radiation, and the surface facing the energy source is mechanically supported by a supporting device in a direction toward the energy source,
   wherein the supporting device is implemented in a form of a grid of linear supporting elements or a side-by-side line arrangement of the linear supporting elements.

2. The arrangement for heat treating the multilayer body according to claim 1, wherein the flexible film has one of the following features:
   a) the flexible film comprises graphite or a composite material, wherein the graphite or the composite material is carbon fiber-reinforced carbon,
   b) the flexible film is a metal foil coated on one or both sides with a corrosion protection layer,
   c) the flexible film is a composite film, wherein the composite film is a metal foil that is bonded to a graphite film on one or both sides by an adhesive.

3. The arrangement for heat treating the multilayer body according to claim 2, wherein the surface element has a thickness of less than 4 mm.

4. The arrangement for heat treating the multilayer body according to claim 1, wherein the surface element has a thickness of less than 4 mm.

5. The arrangement for heat treating the multilayer body according to claim 1, wherein the surface element has a reflection of the heating radiation of less than 10%.

6. The arrangement for heat treating the multilayer body according to claim 1, wherein the surface element has patterning in a form of elevations, wherein the elevations have a height of a few to several hundred microns, measured perpendicular around the surface element.

7. The arrangement for heat treating the multilayer body according to claim 1, wherein the linear supporting elements comprises a metal coated with one selected from the group consisting of a corrosion protection layer, graphite, ceramic, glass ceramic, a glass with a softening point above 800° C., aluminosilicate glass, quartz glass, a composite material,
   wherein the glass with the softening point above 800° C. is borosilicate glass, and
   the composite material is a carbon fiber-reinforced carbon.

8. The arrangement for heat treating the multilayer body according to claim 1, wherein the linear supporting elements occupy less than 10% of the surface facing the energy source.

9. The arrangement for heat treating the multilayer body according to claim 1, wherein the linear supporting elements are partially transparent or transparent to the heating radiation.

* * * * *

UNITED STATES PATENT AND TRADEMARK OFFICE
CERTIFICATE OF CORRECTION

PATENT NO. : 12,490,543 B2  
APPLICATION NO. : 17/435048  
DATED : December 2, 2025  
INVENTOR(S) : Joerg Palm Page 1 of 1

It is certified that error appears in the above-identified patent and that said Letters Patent is hereby corrected as shown below:

On the Title Page

Item (71) Applicant should read:
CNBM RESEARCH INSTITUTE FOR ADVANCED GLASS MATERIALS GROUP CO., LTD.

Signed and Sealed this  
Third Day of February, 2026

John A. Squires  
*Director of the United States Patent and Trademark Office*